(12) United States Patent
Satake

(10) Patent No.: US 11,106,287 B2
(45) Date of Patent: Aug. 31, 2021

(54) STRATIFIED KEYBOARD

(71) Applicant: Yasuhiko Satake, Kamakura (JP)

(72) Inventor: Yasuhiko Satake, Kamakura (JP)

( * ) Notice: Subject to any disclaimer, the term of this patent is extended or adjusted under 35 U.S.C. 154(b) by 0 days.

(21) Appl. No.: 16/997,611

(22) Filed: Aug. 19, 2020

(65) Prior Publication Data

US 2020/0379579 A1 Dec. 3, 2020

Related U.S. Application Data

(63) Continuation of application No. PCT/JP2018/048629, filed on Dec. 28, 2018.

(30) Foreign Application Priority Data

Feb. 23, 2018 (JP) .............................. JP2018-045989

(51) Int. Cl.
*G06F 3/023* (2006.01)
*G06F 3/0488* (2013.01)

(52) U.S. Cl.
CPC .......... *G06F 3/0233* (2013.01); *G06F 3/0238* (2013.01); *G06F 3/04886* (2013.01)

(58) Field of Classification Search
CPC ...... G06F 3/023; G06F 3/0233; G06F 3/0238; G06F 3/04886; H03M 11/06
See application file for complete search history.

(56) References Cited

U.S. PATENT DOCUMENTS

2010/0231523 A1* 9/2010 Chou ...................... G06F 3/018
345/171

2014/0165099 A1* 6/2014 Zhang ..................... H04N 21/47
725/37
2017/0097689 A1* 4/2017 Miller .................. G06F 3/0485

FOREIGN PATENT DOCUMENTS

| CN | 101673144 A | 3/2010 |
| JP | 02-285414 A | 11/1990 |
| JP | 04184612 A | 7/1992 |
| JP | H08272504 A | 10/1996 |
| JP | 200959331 A | 3/2009 |
| JP | 2009129438 A | 6/2009 |
| JP | 2012085249 A | 4/2012 |
| JP | 2014033430 A | 2/2014 |

(Continued)

OTHER PUBLICATIONS

International Preliminary Report on Patentability for PCT/JP2018/048629 dated Aug. 27, 2020 (5 pages).

(Continued)

*Primary Examiner* — Afroza Chowdhury
(74) *Attorney, Agent, or Firm* — Harness, Dickey & Pierce, P.L.C.

(57) ABSTRACT

One is to compose stratified keyboard for commands and symbols. Another is to compose corresponding system between screen displayed virtual keyboard and actual keyboard. For instance, one virtual key on the screen is endowed with certain function and when we touch one key on the actual keyboard whose position is corresponding to that one on the displayed screen, the function belonging to displayed one is executed.
All operations are executed through touching keyboard and thus manipulations get stereo typed and speedy. Furthermore, stratified stereo typed keyboard system for command, symbols, figures and characters propose us the chance to deliberate systematic formation for them.

3 Claims, 3 Drawing Sheets

| Command shift command | Character shift command | 1 | 2 | 3 | 4 | 5 |
|---|---|---|---|---|---|---|
| Switching key for characters | Backspace | 6 | 7 | 8 | 9 | 0 |
| ↑ | → | K | S | T | N | H |
| ↓ | ← | A | I | U | E | O |
| Space | Enter | M | Y | R | W | Switching key for sonant |

(56) References Cited

FOREIGN PATENT DOCUMENTS

| | | |
|---|---|---|
| JP | 2015015690 A | 1/2015 |
| JP | 2015154477 A | 8/2015 |
| JP | 2015231231 A | 12/2015 |
| JP | 2016076195 A | 5/2016 |
| JP | 2016081489 A | 5/2016 |
| JP | 2017212710 A | 11/2017 |
| WO | WO-2009001524 A1 | 12/2008 |
| WO | 2010029448 A1 | 3/2010 |
| WO | WO-2010131759 A1 | 11/2010 |

OTHER PUBLICATIONS

Koyama, Kaori, "MacOS Sierra Master book", Mynavi Publishing Corporation, Oct. 21, 2016, pp. 114-115.
International Search Report for PCT/JP2018/048629 dated Mar. 19, 2019 (4 pages).
Decision to Grant a Patent dated Dec. 18, 2018 in corresponding JP Application No. 2018-045989.
Japanese Office Action dated Sep. 18, 2018 (with English translation) (10 pages).
Koyama, Kaori, "MacOS Sierra Master book", Mynavi Publishing Corporation, (with English translation) Oct. 21, 2016, pp. 114-115.
Decision to Grant a Patent dated Dec. 12, 2018 in corresponding JP Application No. 2018-045989 (with English translation).

\* cited by examiner

| Command shift command | Character shift command | 1 | 2 | 3 | 4 | 5 |
|---|---|---|---|---|---|---|
| Switching key for characters | Backspace | 6 | 7 | 8 | 9 | 0 |
| ↑ | → | K | S | T | N | H |
| ↓ | ← | A | I | U | E | O |
| Space | Enter | M | Y | R | W | Switching key for sonant |

FIG. 1

| Command shift command | Character shift command | F1 | F2 | F3 | F4 | F5 |
|---|---|---|---|---|---|---|
| Switching key for characters | Backspace | F6 | F7 | F8 | F9 | F0 |
| ↑ | → | Start | Media player | Excel | All programs | Administrator |
| ↓ | ← | Document | Picture | Music | Game | Computer |
| Space | Enter | Control panel | Fixed programs | Keyboard command | Explorer | Internet explorer |

FIG. 2

| Command shift command | Character shift command | Arrangement | Property of system | Uninstall of program | Allotment of network drive | Invoke program |
|---|---|---|---|---|---|---|
| Switching key for characters | Backspace | Hard disk | Removable disk | Data | | |
| ↑ | → | | | | | |
| ↓ | ← | | | | | |
| Space | Enter | | | | | |

FIG. 3

|  |  | Arrangement | Invoke | Writing in | New folder | Invoke folder |
|--|--|--|--|--|--|--|
|  |  | Invoke file |  |  |  |  |
|  |  |  |  |  |  |  |
|  |  |  |  |  |  |  |
|  |  |  |  |  |  |  |

STRATIFIED KEYBOARD

CROSS-REFERENCE TO RELATED APPLICATIONS

This application is a Continuation Application of PCT Application No. PCT/JP2018/048629, filed Dec. 28, 2018 and based upon and claiming the benefit of priority from Japanese Patent Application No. 2018-045989, filed Feb. 23, 2018, the entire contents of all of which are incorporated herein by reference.

FIELD OF THE INVENTION

The present invention relates to the field of arrangement of input-method of electronic apparatus through keyboard system.

BACKGROUND

Today, keyboard-input electronic apparatus as personal computer and mobile phone, owing to remarkable development of semiconductor industry, already has same level of high function of the early days super computer.

So, nowadays electronic apparatus ought to be equipped with high operability in inputting and editing characters or in accessing Internet, at least the same level with that of the early days super computer.

But the actual inputting method of keyboard-input electronic apparatus of today does not fully correspond to these needs.

Nowadays, input process of personal computer is usually done through keyboard, but the planning principle or designing idea of keyboard basically does not exceed the standards of mechanic typewriter.

Generally speaking, the keyboard of personal computer consists of the keys bearing the function to input characters and symbols, and the keys bearing the function to indicate the certain form or certain function to the substance already input or going to be input.

First, as for the keys directly inputting characters, keyboard of personal computer is consisted of 48 keys to input characters in wide sense, 38 keys of which are devoted to input characters in narrow sense, 30 keys arranged in 3 lines and 10 columns plus 8 other keys. They are used to input alphabetic characters and Japanese syllabaries, and remaining other 10 keys are used to input figures.

Just as mechanical typewriter, these keys for characters input one character when they are touched once.

Combined with shift keys, these character keys can either distinguish alphabetic character and Japanese syllabary or capital letter and lowercase letter. But this function is no more than carrying on the method in the stage of mechanical typewriter, which already has distinguished capital letter and lowercase letter in a mechanical way.

Also, therein, each rare character like question mark or exclamation mark occupies one key in a similar way as alphabet. On the other hand, massive symbols which can not be set to the keyboard, can be invoked only from the beginning in screen. So, if we are to invoke certain symbol which is situated 1000th, we must invoke 50 keyboards, when the keyboard is set to invoke 20 symbols at once. It is too troublesome.

In the prior art, the problem is resolved through invoking virtual keyboard for inputting characters. But the system of the keyboard stays naïve stage.

On the other hand, as for the command keys which deal with the process of inputting characters or the overall input process, there are approximately 35 keys such as f1 key to F12 key, or enter, shift, alt, ctrl, esc, backspace keys in usual personal computer.

To these command keys, basically one function is designated to each one key, so the range of the realization of command through keyboard is very narrow.

Then so-called shortcut key is utilized to increase the variety of command.

For instance, we can indicate printing through touching ctrl key and p key or indicate to cancel the action just before through touching ctrl key and z key. In these cases, p is an initial letter of printing and z is the final letter in alphabet.

This design is an extension of that of the mechanical typewriter, where new command is created through enhancing its existing function. Just as shown above, we can indicate printing through touching ctrl key and p key or indicate to cancel the action just before through touching ctrl key and z key. In these cases, p is an initial letter of printing and z is the final letter in alphabet.

"Microsoft word 2003 user hand-book" (Syuwa System, 2004) shows a general table for shortcut keys, when screen operation of command is not so popular as today. The table shows 13 examples of the shortcut key through the combination of alt key and another key, 20 examples of the shortcut key through the combination of alt key and other two keys, 40 examples of the shortcut key through the combination of alt key and another keys, 27 examples of the shortcut key through the combination of alt key and other two keys, 18 examples of the shortcut key through the combination of shift key and another key. There are 118 shortcut keys in all.

Among these above-mentioned shortcut keys, in the case of the combination of ctrl key and p key and the combination of ctrl key and z key, there is a certain far fetched relationship between the keys. But as, this sort of relationship is not available for usual case, only some professionals can fully utilize the shortcut method.

Thus, the process of command input is intricate and difficult for usual personal computer with keyboard input system. So, the today's keyboard input system largely relies on the screen input system in inputting their important command. The major cause can be attributed to its outdated designing idea basically following the stage of mechanical typewriter.

Current invention is intended to propose new input method to resolve these difficulties. This new method simultaneously shall propose new perspective for the setting-up of command input and character input system of small-sized keyboard-input personal computer and enhance its utility, the keyboard size of which is supposed to be 3 lines and 5 columns and so on.

PRIOR ART

Patent Reference

WO 2010/131759
Japan Patent Pending No. 2007-258059
Japan Patent Pending No. 2010-294728
Japan Patent Pending No. 2013-097169
Japan Patent Pending No. 2013-151039
Japan Patent Pending No. 2014-044390
Japan Patent Pending No. 2014-127691
Japan Patent Pending No. 2014-216671
Japan Patent Pending No. 2016-118347

DETAILED DESCRIPTION OF THE INVENTION

Chief purpose of current invention consists in breaking down the boundary of traditional pattern and in designing new keyboard which is suitable for the function and capacity of today's keyboard input personal computer.

More definitely, the purpose is to design vertical expanded virtual keyboard system and thus propose new input circumstance which is suitable for electronic apparatus as an aggregation of virtual functions.

First, as for the input of characters and symbols, we will compose stratified keyboard system for enormous bulk of characters and symbols and then set a command key to invoke this stratified keyboard, which is called character shift command key.

Also, we will set special command key which invokes virtual keyboard containing characters and symbols in wide sense for humanities as ⌈ ⌋, < >, !, ?, I, ②, iii, ü, β, ö, ä, ⊥, and another special command key which invokes virtual keyboard containing characters and symbols in wide sense for science as +, −, ×, ÷, =, ≈.
The former is called character shift command key for humanities and the latter is called character shift command key for sciences.

For example, setting character shift command key for humanities to the keyboard of personal computer, we can invoke a virtual keyboard in 3 lines and 10 columns containing such 30 symbols as ?, !, .., ,,, ;, :, /, -, ⌈, ⌋, [,], ⌈, ⌋, (,), <, >, (,), [,], ', ', ", ", {,},. by touching this character shift command key for humanities once.

We can display these 30 symbols invoked to this virtual keyboard on the blank space of the screen of actual personal computer in usual style or on the screen in semi-parent style regardless the position, so as to enable operator to easily touch the actual key on the actual keyboard corresponding to these virtual one.

After having input aimed symbol through this invoked keyboard, the keyboard shall automatically return to basic actual keyboard for characters and symbols to succeed inputting. It is also possible to maintain inputing plural keys on this virtual keyboard by setting the procedure to invoke continuingly the same virtual keyboard through touching enter key at this moment.

In this case, also, after having input aimed symbol through this invoked keyboard, the keyboard shall automatically return to basic actual keyboard for characters and symbols.

When we can not find aimed character or symbol in the character keyboard invoked by symbol shift command key for humanities, next character keyboard shall be invoked by touching this command key once more.

Thus, through touching succeeding symbol shift command key for humanities N times, character keyboard No. N is invoked and we can choose and input any one of 30 by N times symbols.

In the course of above mentioned manipulation, we simply invoke plural symbols covering several fields step by step, we can also invoke symbols quickly and systematically, through setting a procedure to invoke series of symbols according to their field.

More simply, we can put together the same nature symbols in one group. For instance, when we input num (number) and then touch symbol shift command key for humanities, then there shall be invoked initial Roman figures as I II III, and then touching symbol shift command key for humanities again, there shall be invoked lower case Roman figures as i ii iii.

Similarly, when we input let (letter) and then touch symbol shift command key for humanities, then there shall be invoked initial Greek letters as ABΓΔ, and touching symbol shift command key for humanities again, there shall be invoked lower case Greek figures as αβγδ shall be invoked. When we input wm (weights and measures) and then touch symbol shift command key for humanities, then there shall be invoked symbols for unit of weights and measures like g, kg, mm, cm, m, km.

Similarly, we can invoke 30 symbols as +−×÷≈=≠ΩΘΦαβγδ∞≧>≦<≡∞∇∀∝∂∃∈∋ ∫∫∫ through touching symbol shift command key for sciences and we can also invoke succeeding 30 symbols with another touch of this command key. Thus, we can invoke 30 by N times of symbols with 30 by N times touch of this command key.

In this case, in the same way as symbol shift command key for humanities, when we input geo (geometry) and then touch symbol shift command key for sciences, then there shall be invoked symbols for geometry. When we input alg (algebra) and then touch symbol shift command key for sciences, then there shall be invoked symbols for algebra. When we input med (medicine) and then touch symbol shift command key for sciences, then there shall be invoked symbols for medicine. When we chem (chemistry) and then touch symbol shift command key for sciences, then there shall be invoked symbols for chemistry. When we input phys (physics) and then touch symbol shift command key for sciences, then there shall be invoked symbols for physics. When we input bio (biology) and then touch symbol shift command key for sciences, then there shall be invoked symbols for biology.

Remaining problem is, just as in the case of setting command key for invoking virtual characters, to set command key for invoking virtual command keyboard, which is composed as assembly keyboard for invoking commands.

To tell the truth, though this concept is not realized in the case of keyboard input system of personal computer, it is fully realized in screen input system in personal computer, displaying virtual command table on screen and choosing the command through cursor.

Current invention essentially tries to introduce this screen input system of personal computer into keyboard input system of personal computer.

Screen input system has achieved high-degree input system, which freely places the items bearing the function of command on screen and chooses it and inputs it through cursor.

The reason why we dare to introduce this high-level technique into keyboard input system is as follows. Keyboard input system is a single stereotyped input method and once we are accustomed to this manipulation, we can input the contents relatively quick and precise.

That is, keyboard input method has its own merit. It has quick input speed and low sense of fatigue with relatively correct manipulation because it is a single stereotyped input method.

In the case of setting the virtual keyboard for characters and symbols, the purpose is achieved through rather simple way that after touching the invoked key, keyboard shall automatically return to the basic keyboard. But as for the setting of command keys there is another difficulty.

Fore example, suppose in the case, a command key invoked by the command key which is determined to invoke command keyboard, whose tentative name is command shift command key, is delete key, if the keyboard shall soon return to basic keyboard after cancelling one character, then only one character shall be cancelled through this series of procedure. Suppose in the case, a command key invoked by the command key which is determined to invoke command keyboard, is insert key or capslock key, if the keyboard shall soon return to basic keyboard, it is needed to indicate whether this command is limited to be executed once or continually executed. When it is to be continually executed, it is needed to design the procedure to stop this command.

Current invention divides all the command keys into several groups according to their nature and set up procedures to properly execute their functions. For example, such keys as delete key, pagedown key, and pageup key it is needed to design a procedure to allow two kind of executions, one is to execute the command once and then return to basic keyboard, the other is to execute the command continually. Such keys as insert key, capslock key and numlock key it is needed to design a procedure to execute the command continually and then stop working at certain point. In the case of such keys as F1 key to F12 key, escape key, short cut keys as cooperative command by ctrlkey, alt key and delete key, execution of the command results in stepping into the new phase, so, another kind of settingup procedure is needed.

As is mentioned before in article 27, as for characters, after having input aimed symbol through invoked keyboard, keyboard shall automatically return to basic actual keyboard for characters and symbols to succeed inputting. Basically, this method is also adopted for command keys with some modifications. For example, when delete key is invoked by command shift command key, we can set up a procedure to touch enterkey to prolong the command oncemore. When insert key or capslock key is invoked by command shift command key, we can set up a procedure that after executing the continual process of command then invoking the virtual command key oncemore by command shift command and touch it oncemore to stop the command.

We can also refer to current screen input command system in designing command keyboard invoked by command shift command key.

Current invention defines that turning on the power there appears virtual command keyboard with 3 lines and 10 columns or 4 lines 10 columns on the screen.

For example, when we design command keyboard with 4 lines 10 columns, F1 to F10 key shall appear in the top line and command key for each command appears in the second line and below.

For example, starting from left end of the second line, there placed 10 command keys as start, windows, media player, electronic calculator, tag, snipping, tool, Microsoft, excel, paint, magnifier and then from left end of the second line, there placed 10 command keys as card, all programs, administrator, document, picture, music, game, computer, control panel, regulation program, and then at the bottom line, there placed one key: help and support.

As there remain 9 keys here at the bottom line, we can place other several keys as explorer, internet explorer, counter measure for virus, library, or command shift command key to invoke several commands like tab, capslock, numlock, home, end, insert, pagedown, pageup, which are usually invoked by command key being set on keyboard. We can also place the command key to invoke digital dictionary when it is built in.

And then, when this command is active, as is the case with when the power is on in the beginning of operation, touching the key in actual keyboard the position of which is corresponding to that of virtual keyboard, aimed function assigned to this actual key is invoked.

For example, when we touch computer key which is contained in the keyboard invoked at the beginning of operation, there appears next keyboard containing such keys as commanding arrangement, property of system, uninstall and alternation of program, allotment of network drive, executing control panel, hard disk drive, data, device containing removal storage.

Succeedingly, when we choose and invoke the key to execute device containing removal storage, there shall appear the key to invoke folder and file contained in this device along with such keys as arrangement, execute, input, new folder.

When we choose and execute the key to invoke folder and file, there appears, 29 of 39 new key to choose individual folder or file, along with the key to invoke new keyboard.

When we choose certain final file here or choosing folder and finally arrive certain final file and choose it, our command itself is achieved and new stage of inputting operation begins. Command keyboard which is useful in this stage is shown on the screen.

That is, in this stage, there appear new keyboard containing such orders as file, home, insert, pagelayout, reference, thrusting document, proofreading, indication, application, Word, when it is needed to exert command input in this stage of character input, we may touch particularly set command shift command key to enter the dimension of executing command and choose appropriate key from the command keyboard shown on the upper part of the screen.

For example, when we touch home key, then there shall appear such keys as clipboard, font, paragraph, style, and then when we choose clipboard, there shall appear keyboard with such keys as cutting, copy, copy of style, paste. We can also execute copy and paste successively through the same keyboard.

Current invention thus introduces and executes the command of screen input system through keyboard input system, which contributes to increase solidity and speed of operation. Comparing with usual keyboard input personal computer, this method has merit to decrease the keys on the keyboard and then to construct the intricate input system of screen input on the small sized keyboard system.

Here is an example how to plan current invention on small sized personal computer with 3 lines 5 columns keyboard.

Here we adopt the case of Japan patent pending 2013-151039, for basic arrangement of characters.

In this plan of Japan patent pending 2013-151039, lines 7 columns keyboard consisting of 2 lines 5 columns figure input keyboard, 3 lines 5 columns character input keyboard and 5 lines 2 columns command key board is adopted. Current invention places 2 lines 5 columns figure input keyboard and 3 lines 5 columns character input keyboard on the right side of the key board, so that right hand can be used to input figures and characters, and then places 5 lines 2 columns command key board on the left side of the key board, so that left hand can be used to input commands.

When we constitute this 5 lines 7 columns key board with the same scale key and the same key distance of usual personal computer, then the whole size of the key board becomes 9.5 cm long and 13.3 cm broad. This scale is suitable for usual digital dictionary whose whole scale is 10.5 cm long and 14.7 cm broad.

On this 5 lines 2 columns command key board among whole 5 by 7 key board, 10 command keys such as command shift command key, character shift command key, switching key for English, figures and Japanese letter, backspace key, → key, ← key, ↓ key, space key and enter key are placed, which are urgently needed when we input characters.

When we construct screen key board for key board input electronic apparatus, according to the scale of usual dictionary special consideration is needed to provide the relation between character input screen and command input screen, because the given space of screen is very narrow.

For example, more than 10 keys on this screen keyboard are needed immediately in the course of inputting characters. We adopt the skill of shortcut key to deal with this problem.

For example, we define simultaneous touch of backspace key and ↑ key makes the command of division of the display, simultaneous touch of backspace key and ↓ key makes the command of disappearing of the display. After these operations, if we repeat the same operation, original display shall comeback again.

Also, we define simultaneous touch of backspace key and → key makes the command of delete, simultaneous touch of backspace key and ← key makes the command of escape.

We define that simultaneous touch of switching key for English, figures and Japanese letter with → key makes the command of apparel transfer to another command keyboard, simultaneous touch of switching key for English, figures and Japanese letter with ← key makes the command of return to the original apparel keyboard just before, simultaneous touch of switching key for English, figures and Japanese letter with ↑ key makes the command of return to the command table one rank up, simultaneous touch of switching key for English, figures and Japanese letter with ↓ key makes the command of forced termination.

In the case of this small sized keyboard input electronic apparatus, when the power is initially on, all the same with keyboard input personal computer, basic command keyboard appears at first.

Current invention sets 10 command keys from F1 to F10 to the keys corresponding to figure input keys of basic character input keyboard.

And then, we set such 15 command keys as media player, excel, all programs, administrator, document, picture, music, game, computer, control panel, keyboard command, explorer, internet explorer, help and support, chosen from initial display of Windows of usual personal computer, to the corresponding keys of basic character input keyboard.

Here we reduced the number of items which is set on the virtual keyboard according to the nature of small sized electronic apparatus which has few keys, this problem is resolved by setting parallel or coordinate key board with items left behind. This keyboard is invoked thorough simultaneous touch of switching key for English, figures and Japanese letter with → key. Thus, when a electronic dictionary is a resident, we can invoke it with a key in either of the key board.

Then when we choose and touch the key executing computer command, all the same with the case of personal computer, command key board executing such command as property of system, uninstall and change of program, allotment of network drive, invoking control panel, hard disk drive, data, device of removal memory, is invoked.

And then when we choose and touch a key executing the command of device of removal memory, command key board executing such command as arrangement, invoke, writing in, new folder along with a key to invoke folder or file now saved in this device.

After choosing and touching this key to invoke files and folders, we can input or write in all contents needed just the same as usual personal computer.

We design the image of command keyboard shall disappear when this process of inputting characters is set.

This is because in the case of current 3 lines 5 columns keyboard, the size of display is limited to allow command keyboard to co-exist in the same display.

So, we shall design when command keyboard is needed in the process of inputting, we can summon command keyboard again by touching command shift command key.

And this command keyboard or a keyboard to input virtual characters and symbols are displayed in superimposed style on display avoiding to interfere the process of usual inputting and disappear from the display when the final command of this command keyboard or virtual keyboard for characters and symbols is achieved.

This technique to display command keyboard in superimposed style is also available in personal computer.

BRIEF DESCRIPTION OF THE DRAWINGS

FIG. 1 is a figure indicating the essence of current invention. It shows the arrangement of characters and commands on actual command keyboard in 3 lines and 5 columns small sized electronic apparatus.

FIG. 2 is a figure indicating the essence of current invention. It shows the arrangement of inputting commands on virtual command keyboard in 3 lines and 5 columns small sized electronic apparatus.

FIG. 3 is a figure indicating the essence of current invention. It shows the arrangement of a unfolding case of inputting commands on virtual command keyboard in 3 lines and 5 columns small sized electronic apparatus.

EXECUTIVE FORM OF CURRENT INVENTION

Figures 4, 5:
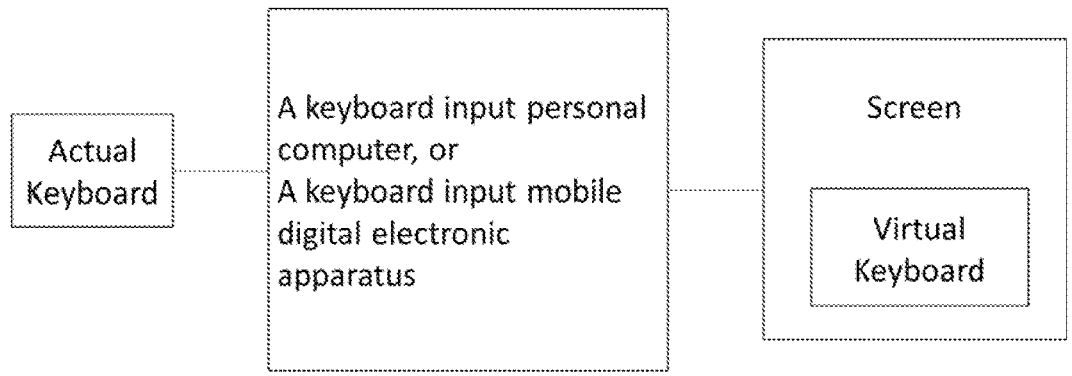
FIG. 4 illustrates a lower subordinate keyboard in accordance with the present disclosure.
FIG. 5 illustrates a relationship between an actual keyboard, a keyboard input personal computer/keyboard input mobile digital electronic apparatus, and a virtual keyboard.

A personal computer, a mobile phone, an electronic dictionary, various controller and so on.
Possibility for Industrial Utilization Current invention, through introducing the input method of screen input electronic apparatus, achieved a high operability not seen among usual keyboard input personal computer.

In usual screen touch input system of electronic apparatus, the operation does not have fixed form and relatively speaking it lacks stability. Current invention resolves this instability and accelerates the speed of command input. Furthermore, each command is situated in the stratified construction of command keyboard, we can construct more self-conscious system than in the case of screen touch system.

Especially, in the case of 3 lines 5 columns keyboard system of current invention, it largely enhanced the operability of usual smartphone, acquired the same level or higher level of operability than in usual personal computer.

Then, combining current invention with above mentioned input system for Japanese, Chinese and European languages, we can achieve multilingual input in small sized electronic apparatus with the same practicality in the case of personal computer.

Thus, firstly we can expect current invention, through enhancing the range of effective function of small sized electronic apparatus, enhances the number of users and the amount of situations.

Secondly, it will change the nature of situation offered by information technology. Usual personal computer is endowed with certain scale, which constricts the situation or time to use it. Current invention rescues this kind of restriction. Users can share information, search data whenever and wherever with this small sized electronic apparatus. So, users can deal with information on a daily basis easily as with pocket book and much more efficiently as with usual personal computer.

Then, unlike with personal computer, current invention enables us daily to share information regardless time and situation.

Thus, current invention has the potential to bring along transfiguration of industrial structure and human relation.

What is claimed is:

1. Input method of keyboard input electronic apparatus including a keyboard input personal computer or a keyboard input mobile digital electronic apparatus which is equipped with an actual keyboard for inputting symbols and commands, the input method comprising:

displaying a virtual keyboard on a screen by converting the actual keyboard, where one command is designated to each actual key, or one symbol is designated to each actual key, into the virtual keyboard, wherein the displaying the virtual keyboard includes displaying the virtual keyboard by turning on the power or by touching a prescribed key; and executing the actual command or the actual symbols by touching the actual key of actual keyboard whose position corresponds to the virtual keyboard, wherein the keyboard input personal computer or the keyboard input mobile digital electronic apparatus is equipped with a stratified command system, where subordinate command keyboard is invoked by prescribed command key and when the subordinate command on the subordinate keyboard is executed, then another lower subordinate keyboard belonging to the subordinate command, is invoked, and wherein the virtual keyboard displays the invoked command keyboard and the virtual keyboard disappears from the screen when a final command in the prescribed command having the stratified command system has been executed.

2. The input method of keyboard input electronic apparatus of claim 1, wherein the actual keyboard of the keyboard input personal computer or the keyboard input mobile digital electronic apparatus is composed of 3 lines and 10 columns in the personal computer, and 3 lines and 5 columns in the mobile digital electronic apparatus.

3. The input method of keyboard input electronic apparatus of claim 1, wherein No. N symbol keyboard is invoked when the command to invoke symbol keyboard is executed N times.

* * * * *